United States Patent
Gonzalez et al.

(10) Patent No.: US 9,615,024 B1
(45) Date of Patent: Apr. 4, 2017

(54) MULTI-RESOLUTION COMPRESSIVE SENSING IMAGE PROCESSING

(71) Applicant: Alcatel-Lucent USA Inc., Murray Hill, NJ (US)

(72) Inventors: Adriana C Gonzalez, Louvain-la-Neuve (BE); Hong Jiang, Warren, NJ (US); Gang Huang, Monroe Township, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 0 days.

(21) Appl. No.: 14/942,020

(22) Filed: Nov. 16, 2015

(51) Int. Cl.
*H04N 5/232* (2006.01)
*G06K 9/46* (2006.01)

(52) U.S. Cl.
CPC ....... *H04N 5/23245* (2013.01); *G06K 9/4671* (2013.01); *G06K 2009/4666* (2013.01)

(58) Field of Classification Search
None
See application file for complete search history.

(56) References Cited

U.S. PATENT DOCUMENTS

| | | | |
|---|---|---|---|
| 8,199,244 B2 | 6/2012 | Baraniuk et al. | |
| 9,070,218 B2 | 6/2015 | Bernal et al. | |
| 9,084,036 B2 | 7/2015 | Jiang et al. | |
| 2010/0183225 A1* | 7/2010 | Vantaram | G06T 7/0081 382/173 |
| 2010/0303348 A1* | 12/2010 | Tolliver | G06T 7/0081 382/164 |
| 2011/0243438 A1* | 10/2011 | Hoppe | G06T 3/4007 382/167 |
| 2012/0082208 A1* | 4/2012 | Jiang | H03M 7/3062 375/240.2 |
| 2012/0262444 A1* | 10/2012 | Stefanoski | G06T 9/001 345/419 |

(Continued)

OTHER PUBLICATIONS

Hong Jiang (Bell Labs) Et Al :"Arbitrary resolution video coding using compressive sensing", Workshop On Picture Coding And Image Processing 2010; Jul. 12, 2010-Jul. 12, 2010; Nagoya., XPX030082080.

(Continued)

*Primary Examiner* — Shahbaz Nazrul
(74) *Attorney, Agent, or Firm* — Niraj A. Desai

(57) ABSTRACT

Systems and methods are provided for constructing a multi-resolution image from a set of compressive measurements representing a compressed version of a single native resolution image. In one aspect, compressive sense measurements are retrieved that were generated using a compressive sensing matrix and represent a compressed version of a single native resolution image of a scene. Dimensions of a desired two-dimensional, multi-resolution image are determined, and a plurality of regions is allocated, each allocated region having a respective resolution. An expansion matrix is defined to map the resolution of each allocated region to the native resolution, and a multi-resolution image of the scene is constructed using the compressive sense measurements, the compressive sensing matrix, and the defined expansion matrices. In various aspects, a full resolution or other multi-resolution images may be constructed from the same compressive measurements without regenerating new compressive measurements.

19 Claims, 6 Drawing Sheets

(56) References Cited

U.S. PATENT DOCUMENTS

2013/0271464 A1* 10/2013 Engel .................. G06T 15/06
                                                    345/426
2015/0317806 A1    11/2015 Bernal

OTHER PUBLICATIONS

Shankar Rao Et Al: "Context and task-aware knowledge-enhanced compressive imaging" SPIE—International Society For Optical Engineering Proceedings. vol. 8877, Sep. 17, 2013, XP055336885, US.
Adriana Gonzalez Et Al: "Multi-resolution compressive sensing reconstruction", ARXIV.ORG, Cornell University Library, 201 Olin Library Cornell University Ithaca, NY 14853, Feb. 18, 2016, XP080684564.
Jiang Hong Et Al: "Scalable Video coding using compressive sensing" Bell Labs Technical Journal, Wiley, CA, US, vol. 16 No. 4, Mar. 2012, XP011627984.
International Search Report—International Application No. PCT/US2016/060769, Filing date: Nov. 7, 2016—Date of Mailing Feb. 6, 2017—4 pages.

* cited by examiner

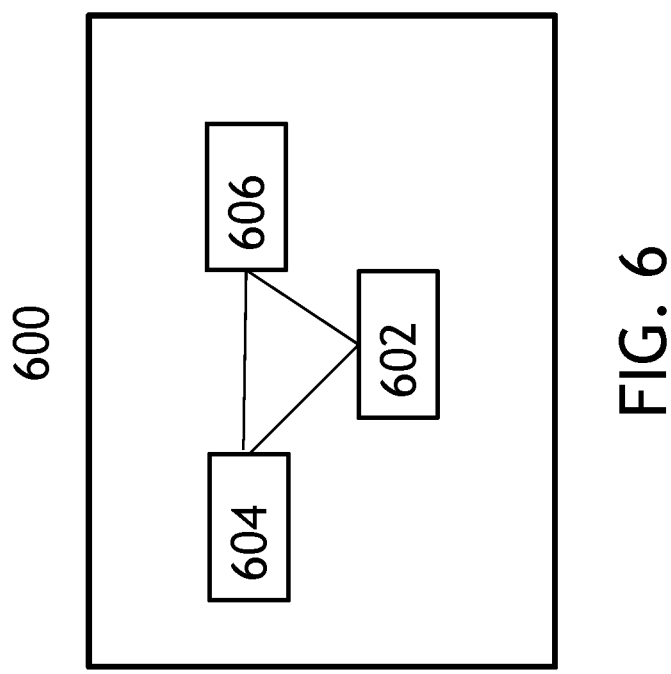

MULTI-RESOLUTION COMPRESSIVE SENSING IMAGE PROCESSING

TECHNICAL FIELD

The present disclosure is directed to systems and methods for compressive sense image processing. More particularly, the present disclosure is directed to constructing a multi-resolution image from compressive measurements representing a single-resolution image.

BACKGROUND

This section introduces aspects that may be helpful in facilitating a better understanding of the systems and methods disclosed herein. Accordingly, the statements of this section are to be read in this light and are not to be understood or interpreted as admissions about what is or is not in the prior art.

Digital image/video cameras acquire and process a significant amount of raw data that is reduced using compression. In conventional cameras, raw data for each of an N-pixel image representing a scene is first captured and then typically compressed using a suitable compression algorithm for storage and/or transmission. Although compression after capturing a high resolution N-pixel image is generally useful, it requires significant computational resources and time. Furthermore, compression of the image raw data after it is acquired does not always result in meaningful compression.

A more recent approach, known in the art as compressive sense imaging, directly acquires compressed data for an N-pixel image (or images in case of video) of a scene. Compressive sense imaging is implemented using algorithms that use random or sparse projections to directly generate compressed measurements for later constructing the N-pixel image of the scene without collecting the conventional raw data of the image itself. Since a reduced number of compressive measurements are directly acquired in comparison to the more conventional method of first acquiring the raw data for each of the N-pixel values of a desired N-pixel image and then compressing the raw data, compressive sensing significantly eliminates or reduce resources needed for compressing an image after it is fully acquired. An N-pixel image of the scene is constructed from the compressed measurements for rendering on a display or other uses.

BRIEF SUMMARY

In various aspects, systems and methods for compressive sense image processing are provided.

One aspect includes retrieving M compressive sense measurements that are generated using a M×N compressive sensing matrix, the compressive sense measurements representing a compressed version of a single native resolution, N-pixel image of a scene; determining dimensions of a desired two-dimensional, multi-resolution image to be reconstructed from the compressive sense measurements; allocating, based on the determined dimensions, a plurality of regions to the desired two-dimensional, multi-resolution image, where each of the allocated plurality of regions has a determined pixel resolution that is equal to or less than the native resolution of the single native resolution image; defining an expansion matrix for each respective allocated region, the dimensions of each expansion matrix being determined for each respective allocated region based on the allocated region's determined pixel resolution; and generating a multi-resolution reconstructed image of the scene using the compressive sense measurements, the compressive sensing matrix, and the defined expansion matrices.

One aspect includes allocating the plurality of regions after the compressive measurements are retrieved.

One aspect includes allocating at least one region of interest having a higher determined pixel resolution than other allocated regions.

One aspect includes reconfiguring the allocated regions of interest by changing one of allocated region of interest or by adding additional regions of interest.

One aspect includes generating the at least one region of interest based on manual input.

One aspect includes generating the at least one region of interest automatically.

One aspect includes displaying the generating a multi-resolution reconstructed image of the scene on a display.

BRIEF DESCRIPTION OF THE DRAWINGS

FIG. 6 illustrates an example apparatus for implementing various aspects of the disclosure.

DETAILED DESCRIPTION

Figure 1:
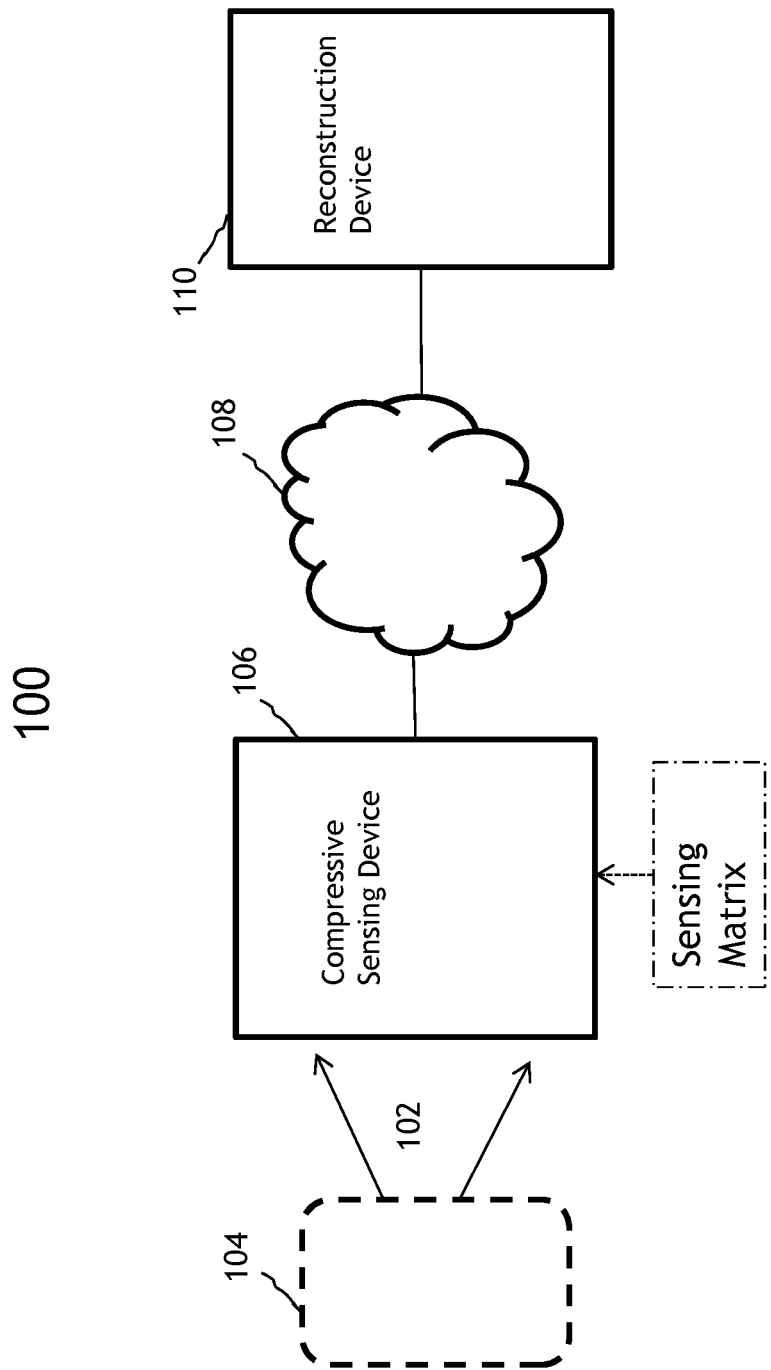
FIG. 1 illustrates an example of a compressive sense imaging system in accordance with various aspects of the disclosure.

Various aspects of the disclosure are described below with reference to the accompanying drawings, in which like numbers refer to like elements throughout the description of the figures. The description and drawings merely illustrate the principles of the disclosure. It will be appreciated that those skilled in the art will be able to devise various arrangements that, although not explicitly described or shown herein, embody the principles and are included within spirit and scope of the disclosure.

As used herein, the term, "or" refers to a non-exclusive or, unless otherwise indicated (e.g., "or else" or "or in the alternative"). Furthermore, as used herein, words used to describe a relationship between elements should be broadly construed to include a direct relationship or the presence of intervening elements unless otherwise indicated. For example, when an element is referred to as being "connected" or "coupled" to another element, the element may be directly connected or coupled to the other element or intervening elements may be present. In contrast, when an element is referred to as being "directly connected" or "directly coupled" to another element, there are no intervening elements present. Similarly, words such as "between", "adjacent", and the like should be interpreted in a like fashion.

Compressive sensing, also known as compressed sampling, compressed sensing or compressive sampling, is a known data sampling technique which exhibits improved efficiency relative to conventional Nyquist sampling. Compressive sampling allows sparse signals to be represented and reconstructed using far fewer samples than the number of Nyquist samples. When a signal has a sparse representation, the signal may be reconstructed from a small number of measurements from linear projections onto an appropriate basis. Furthermore, the reconstruction has a high probability of success when a random sampling matrix is used.

Compressive sensing is generally characterized mathematically as multiplying a N dimensional signal vector by a M×N dimensional sampling or sensing matrix φ to yield an M dimensional compressed measurement vector, where M is typically much smaller than N (i.e., for compression M<<N). If the signal vector is sparse in a domain that is linearly related to that signal vector, then the N dimensional signal vector can be reconstructed (i.e., approximated) from the M dimensional compressed measurement vector using the sensing matrix φ.

Additional details on conventional aspects of compressive sampling can be found in, for example, E. J. Candès and M. B. Wakin, "An Introduction to Compressive Sampling," IEEE Signal Processing Magazine, Vol. 25, No. 2, March 2008, E. J. Candès, "Compressive Sampling," Proceedings of the International Congress of Mathematicians, Madrid, Spain, 2006, and E. Candès et al., "Robust uncertainty principles: Exact signal reconstruction from highly incomplete frequency information," IEEE Trans. on Information Theory, Vol. 52, No. 2, pp. 489-509, February 2006.

In imaging systems, the relationship between compressive measurements or samples $y_k$ (k∈[1 . . . M]) that are acquired by a compressive sensing imaging device for representing a compressed version of a one-dimensional representation of an N-pixel image x ($x_1, x_2, x_3 \ldots x_N$) of a scene can be expressed in matrix form as y=Ax (as shown below) where A (also known as φ) is the M×N sampling or sensing matrix that is implemented by the compressive imaging device to acquire the compressive samples vector y.

$$\begin{bmatrix} y_1 \\ y_2 \\ y_3 \\ \vdots \\ y_M \end{bmatrix} = \begin{bmatrix} a_1[1] & a_1[2] & \ldots & a_1[N] \\ a_2[1] & a_2[2] & \ldots & a_2[N] \\ a_3[1] & a_3[2] & \ldots & a_3[N] \\ \vdots & \vdots & \vdots & \vdots \\ a_M[1] & a_M[2] & \ldots & a_M[N] \end{bmatrix} \cdot \begin{bmatrix} x_1 \\ x_2 \\ x_3 \\ \vdots \\ x_N \end{bmatrix}$$

It will be understood that the vector x ($x_1, x_2, x_3 \ldots x_N$) is itself a one-dimensional representation of a two-dimensional (e.g., row and column) native image, and that known methods, such as concatenating the rows, or the columns, of the two-dimensional image into a single column vector, may be used to mathematically represent the two-dimensional image of known dimensions as a one-dimensional vector and vice versa. The matrix A shown above is also known as a maximum length sensing or sampling matrix, since each row (also known as basis vector) has N values that correspond to the reconstruction of the full resolution N-pixel desired image x of the scene.

It is noted that the focus of the present disclosure is not on the generation of the compressive measurements $y_k$ (k∈[1 . . . M]), and it is assumed herein that the compressive measurements are provided or received from a conventional compressive sensing device. However, a brief description for generating compressive measurements is provided below in FIG. 1.

Instead, the focus of the present disclosure is on the reconstruction of a desired image from the compressive samples, and, in particular, the construction of a multi-resolution image derived from the compressive measurements. In other words, aspects of the present disclosure are directed to the reconstruction of a desired multi-resolution image from the compressive measurements $y_k$ (k∈[1 . . . M]) that were acquired using a M×N maximum length sensing matrix A to represent a compressed version of a single native resolution image.

The systems and methods disclosed herein may be advantageously used in applications such as medical imaging, object recognition or security, or in other applications where generating a full native resolution image from the compressive measurements may not always be necessary or may consume more resources than desired. Notably, the systems and methods disclosed herein do not preclude being able to generate the full native resolution image from the acquired compressive samples if it should be desired or necessary to do so.

These and other aspects of the present invention are now described in more detail below with reference to the figures.

FIG. 1 illustrates a schematic example of a compressive imaging reconstruction system 100 ("system 100") in accordance with various aspects of the present disclosure. Incident light (which may be in the visible or non-visible spectrum) 102 reflecting off a scene 104 is received by a compressive sensing camera device 106, which uses a predetermined maximum length sensing or sampling matrix A to generate a vector y of compressive measurements $y_k$ (k∈[1 . . . M]), where M<<N. As will be understood by those of ordinary skill in the art, the compressive measurements $y_k$ (k∈[1 . . . M]) represent a compressed version of a single native resolution N-pixel image x ($x_1, x_2, x_3 \ldots x_N$) (expressed as a one-dimensional representation of a two dimensional image, using, for example, concatenation of the rows of the two-dimensional image) of the scene 104.

For example, the incident light 102 reflected off the scene 104 may be received at the camera device 106 where the light is selectively permitted to pass, partially pass, or not pass through an N element array of individually selectable aperture elements (e.g., N micro-minors) and strike a photon detector. Which of the N individual aperture elements are partially or fully enabled or disabled to allow (or block) the light to pass through and strike the detector at any particular time may be programmatically controlled using the compressive sensing matrix A. It is assumed herein that the compressive sensing matrix A is a predetermined maximum length matrix. One example of such matrix is a randomly or pseudo-randomly generated M×N Walsh-Hadamard matrix. In other embodiments, matrix A may be any type of sparse matrix suitable for use in compressive sensing having certain well-known properties in Compressed Sensing Theory (e.g. random row selection of an orthogonal matrix).

The compressive sensing camera device 106 may process (e.g., integrate, filter, digitize, etc.) the output of the photon detector periodically to produce a set of M compressive measurements $y_k$ (k∈[1 . . . M]) over respective times $t_1, t_2, \ldots t_M$ using the respective ones of the compressive basis vectors $a_1, a_2, \ldots a_M$ of the compressive sensing matrix A, as will be well understood by one of ordinary skill in the art. As will be further understood, the compressive measurements $y_k$ (k∈[1 . . . M]) collectively represent a compressed image of scene 104. In practice, the number M of the compressive measurements that are generated represent a pre-determined balance between a desired level of compression and the desired native resolution of the full resolution N-pixel image that may be reconstructed using the M compressive measurements. The compressive sensing device 106 may be configured based upon such balance.

The vector y of compressive measurements $y_1, y_2, \ldots y_M$ representing the compressed N-pixel image $x_1, x_2, x_3 \ldots x_N$ of the object 110 may be transmitted by the compressive sensing device 106 to a multi-resolution reconstruction device 110 over a network 108.

As alluded above, in accordance with various aspects of the present disclosure the reconstruction device 110 is configured to generate a multi-resolution image from the compressive measurements. In particular, and as described in detail below, the reconstruction device 110 is configured to generate an image from the compressive measurements in which parts of the image are at a higher resolution than other parts of the image. For example, the image generated by the reconstruction device 110 may have one or more regions of interest which are generated at the full resolution possible (i.e., the single constant native resolution based on which the compressive measurements were acquired) and at least one or more other regions which are generated at a lower resolution than the resolutions of the regions of interest.

Although the devices or units are shown separately in FIG. 1 for ease of understanding, in some embodiments the devices may be combined into a single unit or device. For example, in one embodiment, a single processing device may be configured to provide the functionality both generating the compressive measurements and reconstructing the desired image. The single processing device may include (as in the case where the devices are separate), a memory storing one or more instructions, and a processor for executing the one or more instructions, which, upon execution, may configure the processor to provide the functionality described herein. The single processing device may include other components typically found in computing devices, such as one or more input/output components for inputting or outputting information to/from the processing device, including a camera, a display, a keyboard, a mouse, network adapter, etc. The network 108 may be an intranet, the Internet, or any type or combination of one or more wired or wireless networks.

Figure 2:
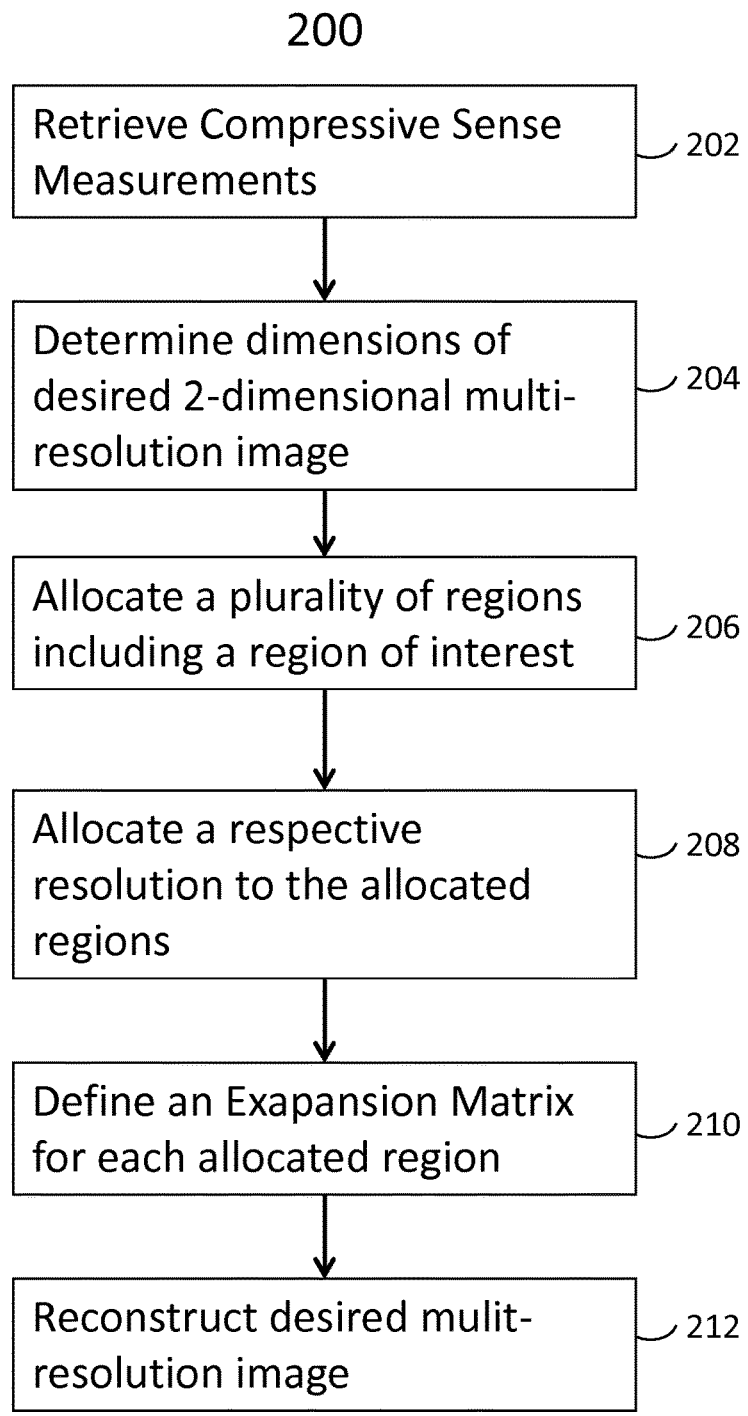
FIG. 2 illustrates an example process for reconstructing an image of the object from the compressive measurements using a reconstruction basis matrix in accordance with various aspects of the disclosure.

A detailed operation of the reconstruction device 110 for generating the multi-resolution image from the compressive samples is now described in conjunction with process 200 illustrated in FIG. 2.

In step 202, the reconstruction device 110 receives or retrieves the compressive measurements y ($y_1, y_2, \ldots y_M$) representing a compressed version of a single native resolution N-pixel image x of a scene that are generated by the compressive sensing device 106 using the M×N compressive sensing matrix. In addition to the compressive measurements, in one embodiment the reconstruction device 110 also receives, from the compressive sensing device 106, the M×N compressive sensing matrix A or information for generating the M×N compressive sensing matrix A that was used by the compressive sensing device to generate the compressive measurements. For example, the sensing matrix may be generated by the reconstruction device based on a received seed value that was used by the compressive sense imaging device to generate the sensing matrix. In other embodiments, since the compressive sensing matrix A that is used by the compressive sensing device 106 to acquire the compressive measurements does not typically change, the compressive sensing device 106 may transmit the compressive sensing matrix A to the reconstruction unit prior to acquiring the compressive measurements, such as, for example, at initialization of the compressive sensing device.

In yet other embodiments, the reconstruction matrix may be known ahead of time, or may be generated by the reconstruction device 110.

In step 204, the reconstruction device 110 determines dimensions of a desired two-dimensional, multi-resolution image to be reconstructed from the compressive sense measurements. The reconstruction device 110 may express the dimensions as a row and column size corresponding to the row and column size of the two-dimensional representation of the one-dimensional N-pixel image x for which the compressive measurements were generated using the sensing matrix, where the number of rows times the number of columns equals N. Representing a two-dimensional image as a one-dimensional vector, and vice versa, will be understood by one or ordinary skill in the art. For example a predetermined concatenation of the rows may be used to map a two-dimensional native resolution image into a one-dimensional vector x at the compressive sense imaging device when generating the compressive sense matrix and the compressive measurements, and the reconstruction device may use the same predetermined concatenation method to determine dimensions of the desired two-dimensional multi-resolution image that correspond to the dimensions of the two-dimensional native resolution image. In other embodiments, the dimensions of the two-dimensional native resolution image may be known or predetermined ahead of time.

In step 206, the reconstruction unit allocates a plurality of regions to the desired multi resolution two-dimensional image to be reconstructed. In other words, this may also be understood as dividing a two-dimensional image into a plurality of regions. Allocating the plurality of regions includes allocating at least one region of interest (ROI) that is deemed to be more important, in terms of resolution, than the other regions.

Figure 3:
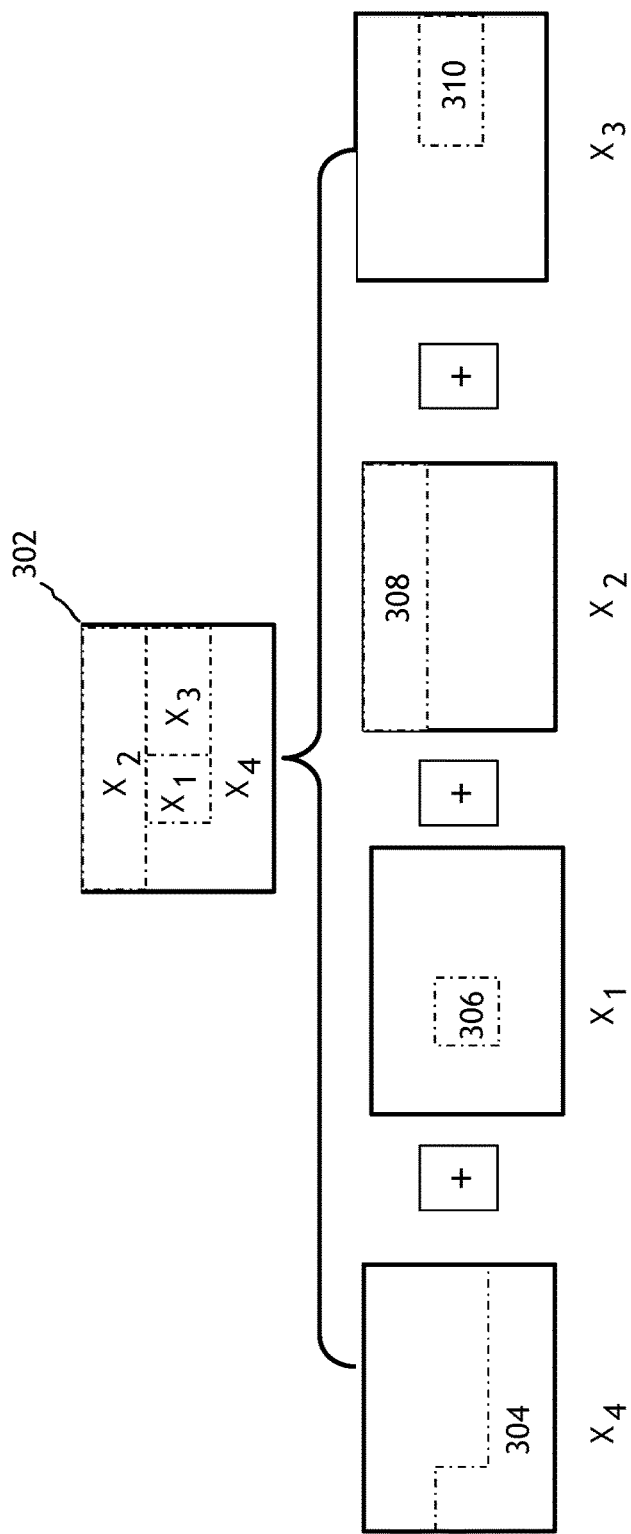
FIG. 3 illustrates an example step of allocating regions to an image in accordance with aspects of the disclosure.

FIG. 3 illustrates a specific example of allocating four regions to a two-dimensional single native resolution image 302. As shown therein, the two dimensional image is partitioned, divided, or allocated into four regions 304, 306, 308, and 310, where, for the purposes of the example, it is assumed that the region denoted as $x_1$ is the allocated region of interest as compared to regions denoted as $x_2$, $x_3$, and $x_4$, which are lower resolution regions that are not part of the ROI. More generally, the allocation of the regions may be expressed as $x=x_1+\ldots+x_P$, where P (four in the example) is the number of regions.

In step 208, each of the allocated plurality of regions (also referenced as blocks) is allocated as a corresponding region with a desired respective resolution to a desired multi-resolution image, where the respective resolution that is allocated to each of the regions of the desired multi resolution image is less than, or equal to, the single native resolution of the compressed image represented by the compressive measurements y ($y_1, y_2, \ldots y_M$).

Figure 4:
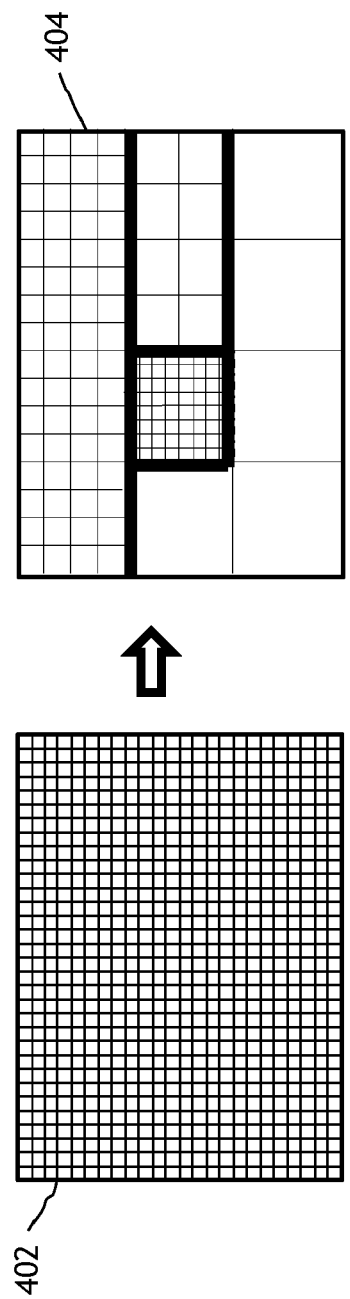
FIG. 4 illustrates an example step of determining resolutions for the allocated regions in accordance with aspects of the disclosure.

FIG. 4 illustrates step 208 for the specific example of FIG. 3 in which four regions were allocated. As seen in FIG. 4, image 402 is the two-dimensional, single native resolution image that is represented by the retrieved compressive measurements, and the fine grid within image 402 is used herein to illustrate the single native resolution. Image 404 is the desired, multi-resolution image to be constructed from the compressive measurements. The image 404 illustrates the corresponding four regions $x_1$, $x_2$, $x_3$, and $x_4$ that were allocated in accordance with the previous steps. Further, grids are shown within each of the four regions of image 404 to illustrate the allocation of a respective resolution to each of the four blocks.

It can be seen from the grids shown in image 404, that the region $x_1$ that was defined as the region of interest, is allocated with a resolution that is equal to the native resolution and has the highest resolution in comparison with the other regions. As the grids also illustrated, the other regions $x_2$, $x_3$ and $x_4$ each have been allocated different resolutions (in descending order) which are all less than the native resolution (and less than the resolution of the determined region of interest).

More generally, the single native resolution for a given one of the P regions can be expressed as $|x_i|=N_i$ and, the resolutions of each of the regions may be allocated as:

$$|\tilde{x}_i| = \frac{N_i}{q_i^2},$$

where $\tilde{x}_i$ is a region i of the desired multi-resolution image $\tilde{x}$ having the desired resolution, $q_i$ is the down sampling factor for each dimension (horizontal and vertical) for each region $x_i$ in the number of P regions that are allocated to the single native resolution image in step 206.

Figure 5:
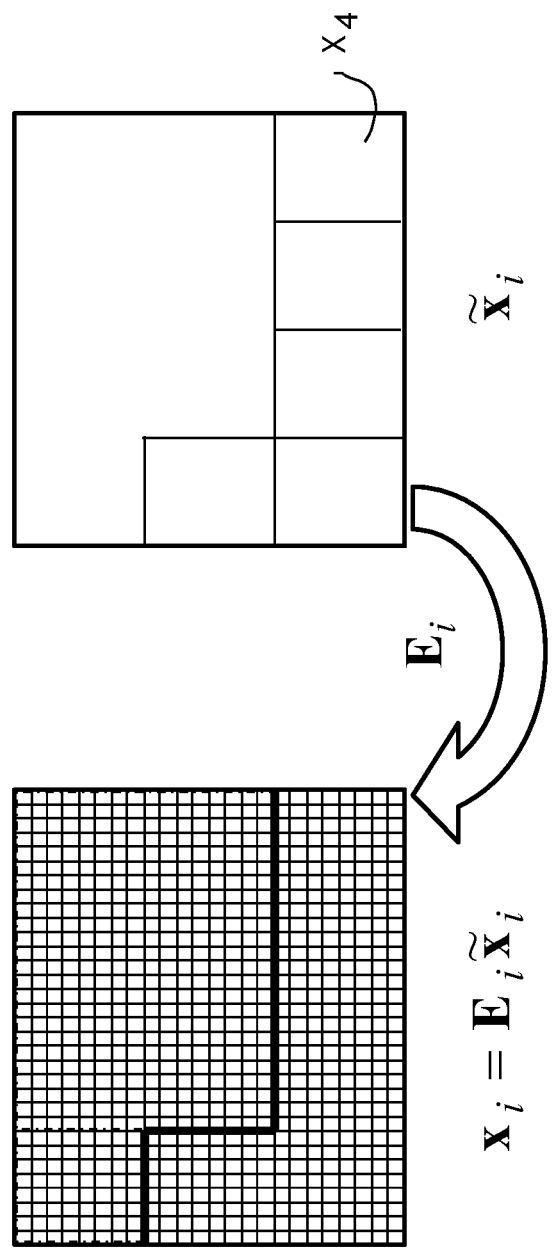
FIG. 5 illustrates an example step of defining an expansion matrix in accordance with aspects of the disclosure.

In step 210, the reconstruction device 110 defines an expansion matrix for each respective allocated region in order to perform a mapping between the multi-resolution regions and the single native resolution image. In general, for each region the expansion matrix is expressed as $x_i=E_i\tilde{x}_i$, where $x_i$ is a given allocated region in the single native resolution image, $\tilde{x}_i$ is the corresponding region in the desired multi-resolution image, and where $E_i$ is the expansion matrix for the given region. FIG. 5 illustrates this step with respect to the specific example of region $x_4$ illustrated in FIG. 3 and FIG. 4. As a result, of step 210, the relationship between the entire single native resolution image x, the expansion matrices $E_1, E_2 \ldots E_P$, and the regions with allocated resolutions of the desired multi-resolution image $\tilde{x}_1, \tilde{x}_2, \ldots \tilde{x}_P$, is given by $x=E_1\tilde{x}_1+ \ldots +E_P\tilde{x}_P$. For example, if a region $\tilde{x}_1$ is allocated to have a resolution that is the same as the native resolution, the corresponding expansion matrix $E_1$ will an identity matrix that satisfies $x_1=E_1\tilde{x}_1=\tilde{x}_1$.

In step 212, the reconstruction unit generates a multi-resolution reconstructed image of the scene using the allocated regions, the expansion matrices, the received compressive sense measurements, and the compressive sensing matrix.

In this step, the generic reconstruction step for generating a desired image from compressive measurements is modified from $y=Ax$ to $y=A(E_1\tilde{x}_1+ \ldots +E_P\tilde{x}_P)$. The modification is used to reconstruct each of the blocks for the desired multi-resolution image. In essence, this step involves iteratively solving:

$$[\tilde{x}_1^*, \ldots , \tilde{x}_P^*]^T = \operatorname*{argmin}_{[\tilde{x}_1, \ldots, \tilde{x}_P]^T} \sum_{i=1}^P \alpha_i f_i(\tilde{x}_i) + g\left(y, A\left(\sum_{i=1}^P E_i\tilde{x}_i\right)\right)$$

In the equation above, each $\tilde{x}_i^*$, i=1, ..., P is one of the reconstructed regions of the multi-resolution image. $\alpha_i$, i=1, ..., P are scaling factors to take into consideration of area of the regions $x_i$, i=1, ..., P, $f_i$, i=1, ..., P are regularization functions that promote a structure of the blocks (e.g., L1-norm). $\tilde{x}_i$ is the allocated region of the multi-resolution image having a desired resolution to be reconstructed. g is a function that characterizes the distance between measurements and acquisition model (e.g., L2 norm). y is the received set of compressive measurements. A is the sensing matrix used to generate y. $E_i$ is the defined expansion matrix for the allocated region $\tilde{x}_i$ having the desired resolution. Once each of the regions $\tilde{x}_i$ of the desired multi-resolution image is solved and obtained, the full or entire desired multi-resolution image x* may be obtained as $x^*=E_1\tilde{x}_1^*+ \ldots +E_P\tilde{x}_P^*$. The generated multi-resolution reconstructed image of the scene may be displayed on a display device in a two-dimensional format as a multi-resolution reconstructed image of the scene.

Systems and methods disclosed herein enable reconstruction or generation of a multi-resolution image suitable for display on a display device based on processing a set of compressive measurements representing a compressed version of a single native resolution image. A number of advantages are believed to accrue in view of the disclosure in comparison with more conventional approaches. The process illustrated herein enables reconstruction of a multi-resolution image based on a set of compressive measurements representing a compressed version of a single native resolution image. Thus, the present disclosure enables different images of different desired resolutions to be constructed from the same set of compressive measurements without having to recapture or regenerate new compressive measurements to support different desired resolutions. Furthermore, since the reconstruction of the multi-resolution image occurs based on and using the same compressive measurements representing the compressed version of the native image, a reconstructed image at the full native resolution may also be constructed, if desired, without having to recapture the scene to generate new compressive measurements for a different resolution.

Furthermore, the region(s) of interest, the number of regions (and the resolutions allocated to the regions) may be varied after the compressive measurements are generated to reconstruct different images at different resolutions without having to generate new compressive measurements suitable for such changes. Additionally, this also means that the process to reconstruct the multi-resolution images may occur in a device other than the compressive sense image capturing device, thus alleviating much of the computational resources that would be required if the image capturing device had to reconfigure the sensing matrix and recapture images based on different desired resolutions. Advantageously, this reduces costs of the compressive sense image capturing device and makes it suitable for mass deployment, without having to take into consideration the different regions or different resolutions that may be desired during processing, and without having to reconfigure the compressive sense imaging device differently for different situations.

The regions described herein, including the region of interest having the higher resolution than other regions, may be determined in several ways. For example, in one embodiment a region of interest (and the other regions) may be determined based on manual input to the reconstruction device. In some embodiments, a very low resolution preview image may be constructed to identify one or more regions including the region of interest, and then the desired multi-resolution image may be constructed based on the preview image. In another embodiment, the region of interest may be determined automatically, such as based on a known or determined feature (e.g., a door in a security application) of the scene that is captured, and the rest of the image may be considered a lower resolution region. In yet other embodiments, the regions of interest may be determined such that the central area of the image is allocated with a higher resolution, followed by one or more surrounding areas that are allocated as the other regions with lesser resolutions in descending order (or the same resolution). Other conventional approaches to determine a region of interest may also be used, such as determining an overlap coverage area based on views of multiple cameras capturing a scene and determining the overlap area as a region of interest, as will be understood by those of skill in the art. While four regions were illustrated in the example above, it will be understood that there may be fewer or greater number of regions with respectively allocated resolutions. In one embodiment, there may be one region of interest having a higher resolution (e.g., native resolution) and the rest of the image may be considered a second region having a lower resolution than the region of interest.

The expansion matrix (E) disclosed herein for each region allows the mapping between a respective lower resolution region $\tilde{x}_i$ and the original native resolution region $x_i$. In general terms, to obtain an original resolution matrix or region (d) includes repeating the elements of the low resolution matrix or region ($\tilde{d}$) in blocks of size q×q where $d=E\tilde{d}=\tilde{d}\otimes 1_{q\times q}$. As a particular example a four element low resolution matrix or region ($\tilde{d}$) may be mapped using an expansion matrix $1_{2\times 2}$ to a native resolution 16 element matrix or region d as:

$$\begin{bmatrix} d_1 & d_2 \\ d_3 & d_4 \end{bmatrix} \otimes \begin{bmatrix} 1 & 1 \\ 1 & 1 \end{bmatrix} = \begin{bmatrix} d_1 & d_1 & d_2 & d_2 \\ d_1 & d_1 & d_2 & d_2 \\ d_3 & d_3 & d_4 & d_4 \\ d_3 & d_3 & d_4 & d_4 \end{bmatrix}$$

To go the other way, that is, to obtain a low resolution matrix or region ($\tilde{d}$) from the original native resolution region (d) involves summing the elements of the original resolution matrix (d) that are inside blocks ($B_{q\times q}$) of size q×q as:

$$\tilde{d}=E^T d=\Sigma_{k\in B_{q\times q}} d_k$$

FIG. 6 depicts a high-level block diagram of a computing apparatus 600 suitable for implementing various aspects of the disclosure (e.g., one or more steps of process 200). Although illustrated in a single block, in other embodiments the apparatus 600 may also be implemented using parallel and distributed architectures. Thus, for example, one or more of the various units of architecture 100 of FIG. 1 discussed above, and other components disclosed herein may be implemented using apparatus 200. Furthermore, various steps such as those illustrated in the example of process 200 may be executed using apparatus 600 sequentially, in parallel, or in a different order based on particular implementations. Exemplary apparatus 600 includes a processor 602 (e.g., a central processing unit ("CPU")), that is communicatively interconnected with various input/output devices 604 and a memory 606.

The processor 602 may be any type of processor such as a general purpose central processing unit ("CPU") or a dedicated microprocessor such as an embedded microcontroller or a digital signal processor ("DSP"). The input/output devices 604 may be any peripheral device operating under the control of the processor 602 and configured to input data into or output data from the apparatus 600, such as, for example, network adapters, data ports, and various user interface devices such as a keyboard, a keypad, a mouse, or a display.

Memory 606 may be any type or combination of memory suitable for storing and accessing electronic information, such as, for example, transitory random access memory (RAM) or non-transitory memory such as read only memory (ROM), hard disk drive memory, database memory, compact disk drive memory, optical memory, etc. The memory 606 may include data and instructions which, upon execution by the processor 602, may configure or cause the apparatus 600 to perform or execute the functionality or aspects described hereinabove (e.g., one or more steps of process 200). In addition, apparatus 600 may also include other components typically found in computing systems, such as an operating system, queue managers, device drivers, database drivers, or one or more network protocols that are stored in memory 606 and executed by the processor 602.

While a particular embodiment of apparatus 600 is illustrated in FIG. 6, various aspects in accordance with the present disclosure may also be implemented using one or more application specific integrated circuits (ASICs), field programmable gate arrays (FPGAs), or any other combination of dedicated or programmable hardware.

Although aspects herein have been described with reference to particular embodiments, it is to be understood that these embodiments are merely illustrative of the principles and applications of the present disclosure. It is therefore to be understood that numerous modifications can be made to the illustrative embodiments and that other arrangements can be devised without departing from the spirit and scope of the disclosure.

The invention claimed is:

1. An apparatus for processing compressive sensed images, the apparatus comprising:
    a memory for storing instructions and data; and,
    a processor communicatively coupled to the memory and configured to access the data and the instructions, which, when executed by the processor, configure the processor to:
       retrieve M compressive sense measurements that are generated using a M×N compressive sensing matrix, the compressive sense measurements representing a compressed version of a single native resolution, N-pixel image of a scene;
       determine dimensions of a desired two-dimensional, multi-resolution image to be reconstructed from the compressive sense measurements;
       allocate, based on the determined dimensions, a plurality of regions to the desired two-dimensional, multi-resolution image, where each of the allocated plurality of regions has a determined pixel resolution that is equal to or less than the native resolution of the single native resolution image;
       define an expansion matrix for each respective allocated region, the dimensions of each expansion matrix being determined for each respective allocated region based on the allocated region's determined pixel resolution; and
       generate a multi-resolution reconstructed image of the scene using the compressive sense measurements, the compressive sensing matrix, and the defined expansion matrices.

2. The apparatus of claim 1, wherein the processor is further configured to allocate the plurality of regions after the compressive measurements are retrieved.

3. The apparatus of claim 1, wherein the processor is further configured to allocate at least one region of interest having a higher determined pixel resolution than other allocated regions.

4. The apparatus of claim 3, wherein the processor is further configured to reconfigure the allocated regions of interest by changing one of the allocated regions of interest or by adding additional regions of interest.

5. The apparatus of claim 3 wherein the processor is further configured to generate at least one region of interest based on manual input.

6. The apparatus of claim 3 wherein the processor is further configured to generate at least one region of interest automatically.

7. A computer-implemented method for processing compressive sensed images, the method comprising:
retrieving M compressive sense measurements that are generated using a M×N compressive sensing matrix, the compressive sense measurements representing a compressed version of a single native resolution, N pixel image of a scene;
determining dimensions of a desired two-dimensional, multi-resolution image to be reconstructed from the compressive sense measurements;
allocating, based on the determined dimensions, a plurality of regions to the desired two-dimensional, multi-resolution image, where each of the allocated plurality of regions has a determined pixel resolution that is equal to or less than the native resolution of the single native resolution image;
defining an expansion matrix for each respective allocated region, the dimensions of each expansion matrix being determined for each respective allocated region based on the allocated region's determined pixel resolution; and
generating a multi-resolution reconstructed image of the scene using the compressive sense measurements, the compressive sensing matrix, and the defined expansion matrices.

8. The computer-implemented method of claim 7, further comprising allocating the plurality of regions after the compressive measurements are retrieved.

9. The computer-implemented method of claim 7, allocating at least one region of interest having a higher determined pixel resolution than other allocated regions.

10. The computer-implemented method of claim 9, further comprising reconfiguring the allocated regions of interest by changing one of allocated region of interest or by adding additional regions of interest.

11. The computer-implemented method of claim 9 further comprising generating at least one region of interest based on manual input.

12. The computer-implemented method of claim 9 further comprising generating at least one region of interest automatically.

13. The computer-implemented method of claim 7, further comprising displaying the generated multi-resolution reconstructed image of the scene on a display.

14. A non-transitory computer-readable medium including one or more instructions for configuring a processor for:
retrieving M compressive sense measurements that are generated using a M×N compressive sensing matrix, the compressive sense measurements representing a compressed version of a single native resolution, N pixel image of a scene;
determining dimensions of a desired two-dimensional, multi-resolution image to be reconstructed from the compressive sense measurements;
allocating, based on the determined dimensions, a plurality of regions to the desired two-dimensional, multi-resolution image, where each of the allocated plurality of regions has a determined pixel resolution that is equal to or less than the native resolution of the single native resolution image;
defining an expansion matrix for each respective allocated region, the dimensions of each expansion matrix being determined for each respective allocated region based on the allocated region's determined pixel resolution; and
generating a multi-resolution reconstructed image of the scene using the compressive sense measurements, the compressive sensing matrix, and the defined expansion matrices.

15. The non-transitory computer readable medium of claim 14, further including one or more instructions for configuring the processor for allocating the plurality of regions after the compressive measurements are retrieved.

16. The non-transitory computer readable medium of claim 15, further including one or more instructions for configuring the processor for allocating at least one region of interest having a higher determined pixel resolution than other allocated regions.

17. The non-transitory computer readable medium of claim 16, further including one or more instructions for configuring the processor for reconfiguring the allocated regions of interest by changing one of the allocated regions of interest or by adding additional regions of interest.

18. The non-transitory computer readable medium of claim 16, further including one or more instructions for configuring the processor for generating at least one region of interest based on manual input.

19. The non-transitory computer readable medium of claim 16, further including one or more instructions for configuring the processor for generating at least one region of interest automatically.

* * * * *